United States Patent
Ketonen et al.

(10) Patent No.: US 6,330,153 B1
(45) Date of Patent: Dec. 11, 2001

(54) METHOD AND SYSTEM FOR EFFICIENTLY REMOVING HEAT GENERATED FROM AN ELECTRONIC DEVICE

(75) Inventors: Veli-Pekka Ketonen, Irving; Steven J. Laureanti, Lewisville, both of TX (US)

(73) Assignee: Nokia Telecommunications Oy, Espoo (FI)

( * ) Notice: Subject to any disclaimer, the term of this patent is extended or adjusted under 35 U.S.C. 154(b) by 0 days.

(21) Appl. No.: 09/229,879

(22) Filed: Jan. 14, 1999

(51) Int. Cl.⁷ ....................................................... H05K 7/20
(52) U.S. Cl. ........................... 361/690; 361/689; 361/691; 361/694; 361/697; 361/703; 361/704; 361/709; 361/719; 361/720; 257/721; 257/722; 174/15.1; 174/16.1; 174/16.3; 165/80.3; 165/122; 165/104.33; 165/908
(58) Field of Search ...................................... 361/687–704, 361/707, 709–711, 717–720; 257/706, 712–716, 721, 722; 174/15.1, 15.2, 16.1, 16.3; 165/80.3, 80.4, 104.33, 104.34, 122, 908

(56) References Cited

U.S. PATENT DOCUMENTS

| 4,931,905 |   | 6/1990 | Cirrito et al. .......................... 361/385 |
| 5,006,924 | * | 4/1991 | Frankeny et al. ..................... 257/714 |
| 5,294,831 |   | 3/1994 | Azar et al. ............................ 257/722 |
| 5,351,166 | * | 9/1994 | Kang ..................................... 165/908 |
| 5,535,818 |   | 7/1996 | Fujisaki et al. .................. 165/104.33 |
| 5,651,260 | * | 7/1997 | Goto et al. ............................. 62/126 |
| 5,676,198 | * | 10/1997 | Schneider et al. ................... 165/80.3 |
| 5,794,687 | * | 8/1998 | Webster, Jr. et al. ................ 361/697 |
| 5,864,465 | * | 1/1999 | Liu ....................................... 361/697 |
| 5,894,987 | * | 4/1999 | Layne et al. ........................ 165/80.3 |
| 5,915,463 | * | 6/1999 | Romero et al. ..................... 165/80.3 |
| 5,950,714 | * | 9/1999 | Schneider et al. ................... 165/80.3 |

FOREIGN PATENT DOCUMENTS

WO 96/29553   9/1996   (WO) .

* cited by examiner

*Primary Examiner*—Gerald Tolin
*Assistant Examiner*—Boris H. Chervinsky
(74) *Attorney, Agent, or Firm*—Brooke Hayes; Brian T. Rivers

(57) ABSTRACT

A system for cooling an electronic device comprising a heat sink including a channel having an inlet and an outlet, with the channel coupled to an airflow generation system that generates airflow between the inlet and outlet. Heat is removed from an electronic device by decreasing the cross-sectional area of the channel to provide a throttle at a location adjacent to where the channel traverses the electronic device. A plurality of throttles may be formed in the channel, each for cooling a separate electronic device. An airflow control valve is operably connected to the heat sink for controlling the amount of airflow through the heat sink. A device controller connected to the airflow control valve and the air generation system adjusts the airflow control valve according to temperature measurements collected from the electronic device and controls the operation of the air generation system.

16 Claims, 4 Drawing Sheets

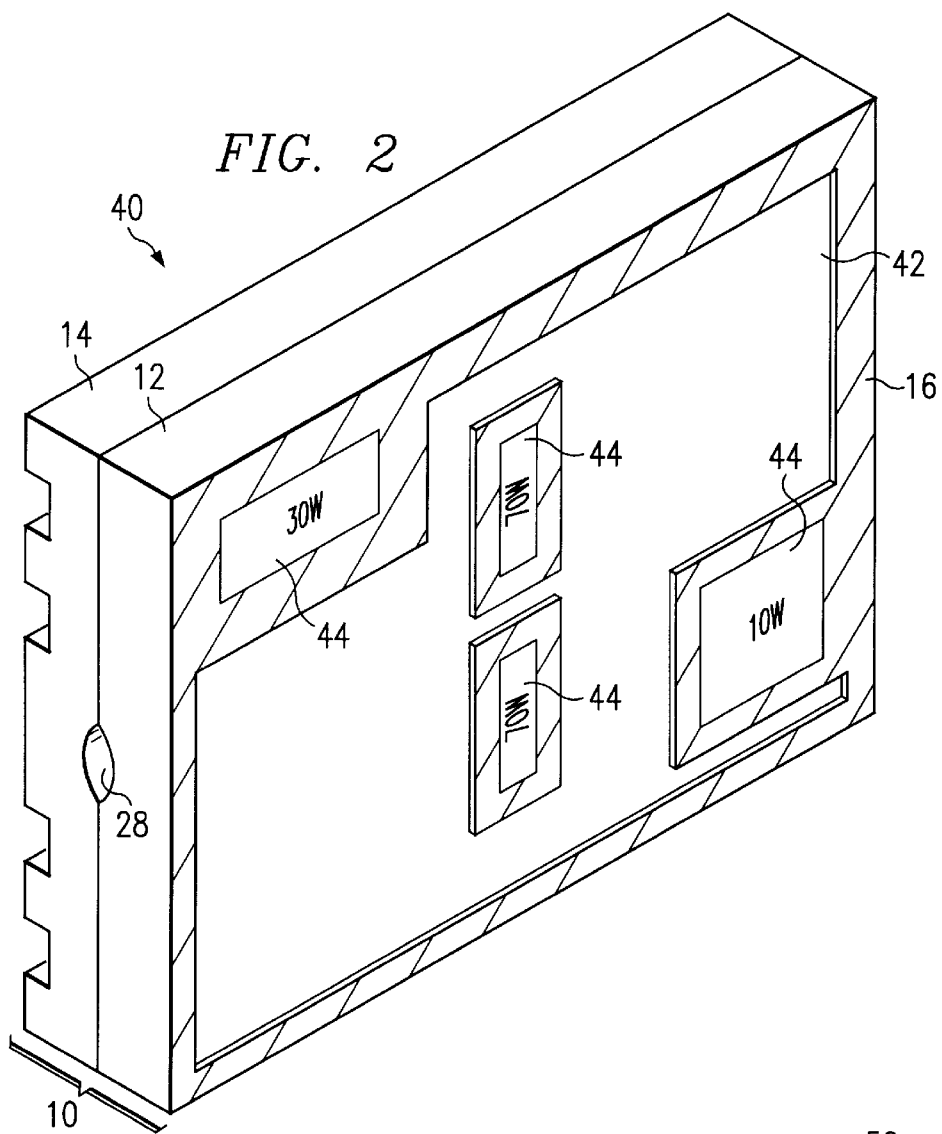
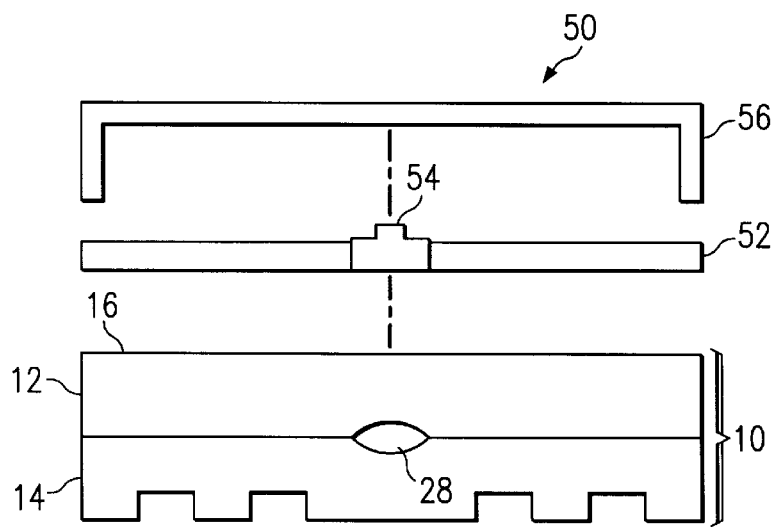

METHOD AND SYSTEM FOR EFFICIENTLY REMOVING HEAT GENERATED FROM AN ELECTRONIC DEVICE

FIELD OF THE INVENTION

The present invention relates, in general, to heat transfer mechanisms, and in particular to a method and system for removing heat generated from high power air-cooled electronic devices.

BACKGROUND OF THE INVENTION

Without limiting the scope of the invention, its background is described in connection with the removal of heat dissipated from high-powered electronic devices, associated with base station circuitry components as an example.

A base station provides a means of reception and transmission to and from wireless communication mobile units and provides an interface to a telecommunication network. For this purpose, base stations comprise a transceiver unit comprising an input for receiving signals to be transmitted, a signal processor for processing signals to be transmitted on a predetermined frequency channel, and a power amplifier for amplifying and feeding the signals to be transmitted to the transmitter unit's antenna.

High power levels generated in the transceiver's power amplifier cause increased temperature levels. If the power amplifier is not properly cooled, dramatic temperature increases could result in significant damage to the overall transceiver. Also, temperature increases generated within high performance semiconductors, such as the power transistor, could vary the electrical performance characteristics of the transceiver unit and cause the degradation of materials resulting in reduced reliability and device failure.

Typically, cooling in power amplifiers is accomplished using a large heat sink that includes cooling fins. This heat sink is directly attached to a flange of the power amplifier devices to provide low thermal resistance. Usually, at the temperature levels associated with base station power amplifiers, the passive cooling provided by the heat sink is not sufficient. Further cooling of power amplifiers may be accomplished by the use of natural airflow or by purposely applying cool airflow to the heat sinks to reduce their temperatures.

The basic idea with fan and fins is to spread heat over the surface of the heat sink enough so that it is possible to remove the heat with a relatively low airspeed fan. Use of the heat sink with fins and a fan has many shortcomings. In order to effectively remove heat generated from high-powered electronic devices at the temperature levels associated with base station power amplifiers, the heat sink would require a large surface area, resulting in an inefficient use of space. A base station comprises several power amplifiers and would require a separate fan for each amplifier. The result is an overall increase in expense for each base station and a decrease in system reliability. In the event that a fan used to cool such equipment fails, overheating could result in the destruction of base station equipment.

As may be seen, therefore, improved methods of removing generated heat from high-powered electronic devices, for example, those used in a base station environment could provide a commercially useful article and reduce replacement expenses, maintenance costs and inconvenience in sudden breakdown of base station system components.

OBJECTS OF THE INVENTION

It is an object of the present invention to provide a system for cooling an electronic device comprising a pump for generating airflow through a heat sink coupled to an electronic device.

It is an object of the present invention to provide a system for cooling an electronic device comprising a compressor for generating airflow through a heat sink coupled to an electronic device.

It is another object of the present invention to increase the velocity of airflow through a portion of the heat sink where heat dissipation is concentrated.

It is another object of the present invention to provide a heat sink coupled to an electronic device with heat sink having a channel having an inlet and an outlet with a throttle for increasing airflow velocity disposed between inlet and outlet.

It is another object of the present invention to provide an airflow control valve operably connected to the inlet of the heat sink for controlling the amount of airflow through the heat sink.

It is another object of the present invention to provide a device controller connected to the airflow control valve and to the air generation system for controlling the airflow control valve and the operation of the air generation system.

SUMMARY OF THE INVENTION

The present invention presents an improved method of removing generated heat from heat-generating electronic devices where multiple heat-generating electronic devices are used in confined spaces. For example, within a base station where multiple transceivers employing the use of power amplifiers are used, this method allows more efficient utilization of space in the base station and increases a base station's reliability and performance.

In an embodiment, the invention comprises a system for cooling an electronic device comprising an air generation system used for generating airflow through a heat sink coupled to an electronic device. The system for cooling an electronic device comprises a pump for generating airflow through the heat sink. Alternatively, the system for cooling an electronic device may comprise a compressor for generating airflow through the heat sink.

The embodiment comprises a heat sink having a channel having an inlet and an outlet with the outlet connected to the pump or the inlet connected to the compressor. The present invention efficiently removes heat from an electronic device by decreasing the cross-sectional area of the channel where the channel traverses the electronic device. The decrease in cross-sectional area increases the velocity of airflow through a portion of the heat sink where heat dissipation is concentrated.

The embodiment may also include an airflow control valve operably connected to the inlet of the heat sink for controlling the amount of airflow through the heat sink. The present invention provides a device controller connected to the airflow control valve and to the air generation system for controlling the airflow control valve and the operation of the air generation system.

BRIEF DESCRIPTION OF THE DRAWINGS

For a more complete understanding of the present invention, including its features and advantages, reference is now made to the detailed description of the invention, taken in conjunction with the accompanying drawings of which:

FIG. 2 is an illustration of a power amplifier module in accordance with the present invention;

FIG. 3 is a cutaway front view of a transceiver unit used in a wireless base station communications system in accordance with the present invention;

DETAILED DESCRIPTION OF THE INVENTION

While the making and using of particular embodiments of the present invention are presented in detail below, it will be understood that the present invention provides many applicable inventive concepts, which can be embodied in a wide variety of specific contexts. The specific embodiments discussed herein are merely illustrative of specific ways to make and use the invention and do not limit the scope of the invention.

Figure 1B:
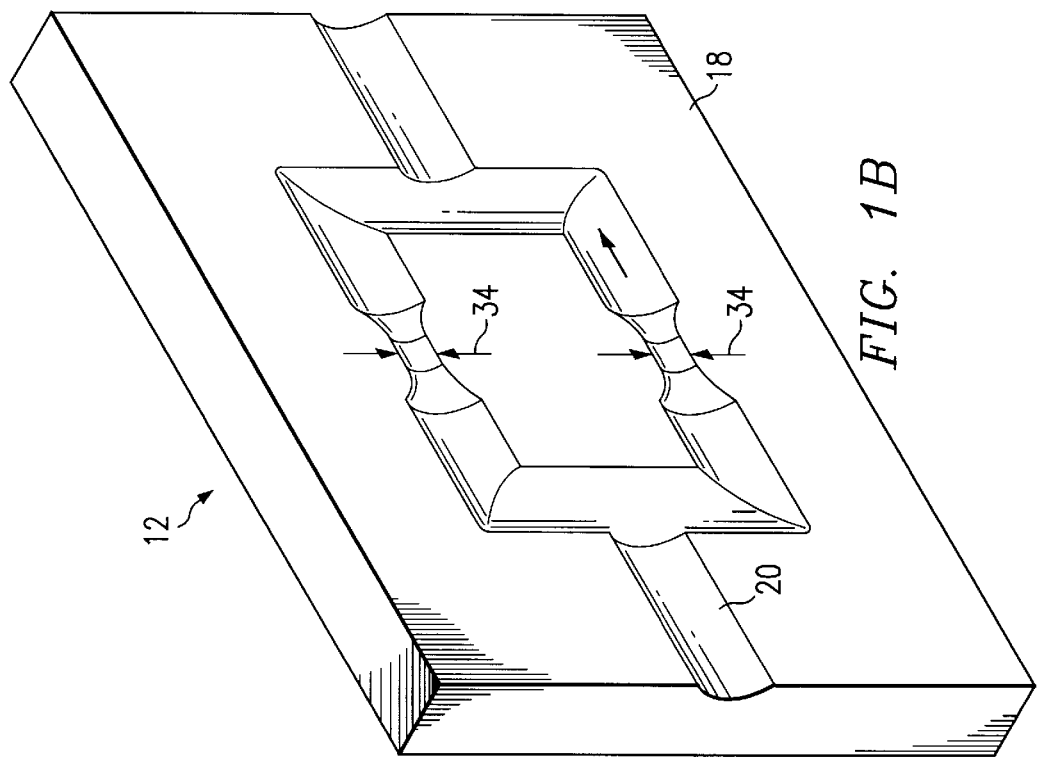
FIG. 1B is an illustration of a bottom perspective view of a heat sink base in accordance with the present invention.
Figure 1A:
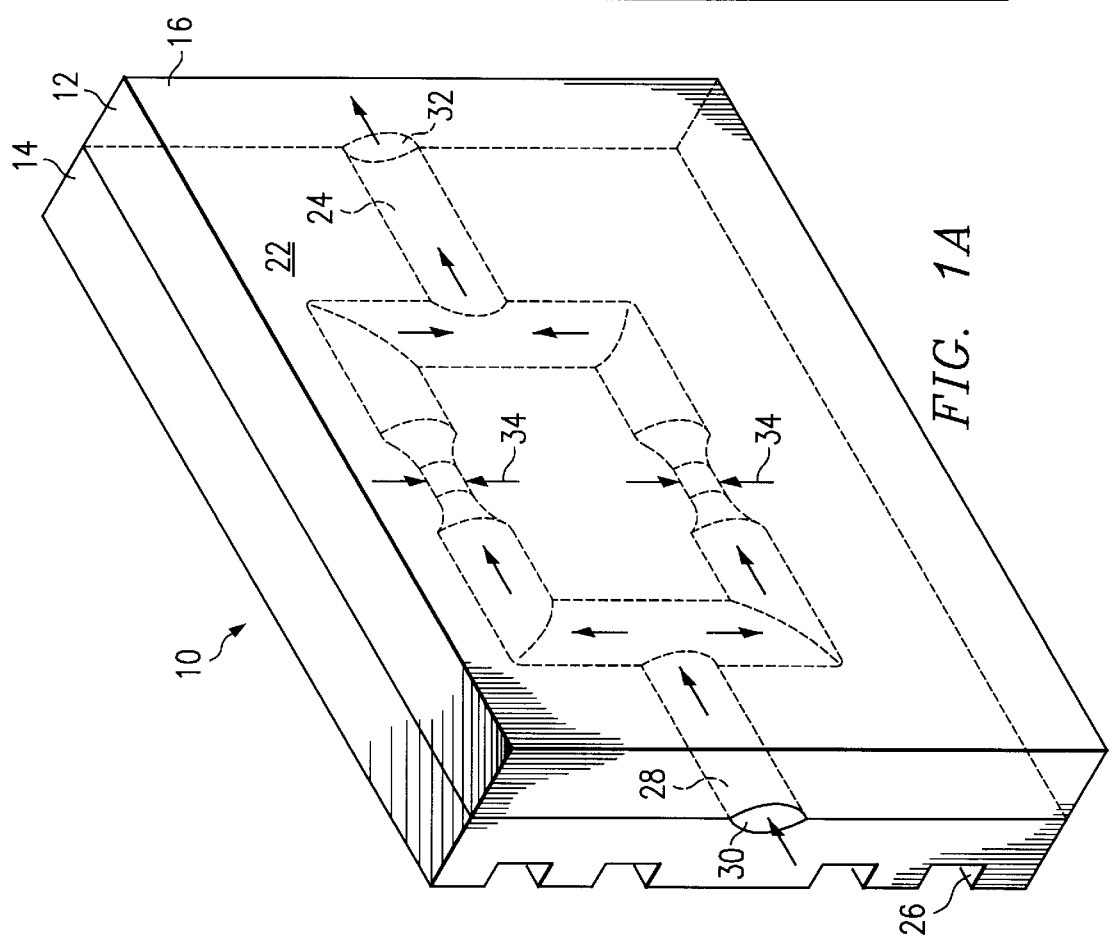
FIG. 1A is an exposed view of a heat sink in accordance with the present invention.

Referring to FIG. 1A, therein an exposed view of a heat sink is illustrated in accordance with the present invention and denoted generally as 10. Heat sink 10 comprises a heat sink base 12 and a finned heat sink 14. Heat sink base 12 comprises a top surface 16 for receiving electronic devices and an upper inner surface 18, as illustrated in FIG. 1B. FIG. 1B is a bottom perspective view of heat sink base 12 of FIG. 1A, wherein heat sink base 12 comprises a groove 20 etched into the upper inner surface 18. Finned heat sink 14 comprises a lower inner surface 22 with a groove 24 etched into the lower inner surface 22, as illustrated in FIG. 1A by the dashed lines, and a bottom surface 26 comprising parallel vertical fins. The vertical and parallel fins may be any height and width necessary to spread heat away from the electronic devices.

The upper inner surface 18 and the lower inner surface 22 are congruent halves and when assembled together define a channel 28 permitting the flow of air, indicated by the direction of arrows in FIG. 1A, through heat sink 10. Heat sink base 12 and finned heat sink 14 when assembled hermetically enclose channel 28, creating an airtight passage having an inlet 30 and an outlet 32. Heat sink 10 may be made from any heat conductive material, for example, aluminum, copper, or any other material suitable for transferring heat away from electronic device.

The upper inner surface 18 of heat sink base 12 as illustrated in FIG. 1B shows the groove 20, which forms the upper half of channel 28. Groove 20 and groove 24 may be any configuration necessary to direct airflow across several locations of upper inner surface 18. Channel 28 begins as a single channel and branches into two channels for directing the flow of air to target locations through a portion of the channel 28 where heat dissipation from an electronic device may be most concentrated. Channel 28 may be a single channel or may be branched multiple times to traverse multiple locations throughout heat sink 10.

The velocity of the airflow is increased by selectively decreasing the cross-sectional area of channel 28 at a point, referred to herein as throttle 34, where heat is most concentrated. Throttle 34 enforces a low pressure where channel 28 narrows, which increases velocity of airflow at this point. Channel 28 may be rectangular, round or any other shape using heat conductive material and may be formed using any known method. For example, channel 28 may be formed by crystal-orientation-dependent etching, precision sawing, electric discharge machining, or numerically controlled machining.

Referring to FIG. 2, therein a power amplifier module in accordance with the present invention is illustrated and denoted generally as 40. Although a power amplifier module 40 with an arrangement of electronic devices is described in accordance with the present invention, any electronic module with any configuration of electronic devices may be used employing the techniques of the present invention. Heat sink base 12 may have a substantially planar or cubic top surface 16 machined for receiving an electronic device, such as a Printed Circuit Board (PCB) 42 or a high-powered semiconductor device, such as power transistors 44. Power transistors 44 are typically coupled to the heat sink base 12 with a flange and screws or a heat-conductive adhesive to accommodate the extraction of heat from the circuit elements to the heat sink 10 during operation.

The PCB 42 may comprise many smaller electronic devices, and the amount of heat dissipated from these electronic devices is considered relatively small when compared to the amount of heat generated from high-powered electronic devices, such as the power transistors 44. Therefore, heat generated from the PCB 42 uses the thermal conduction path of the heat sink 10 to sink heat away from the PCB 42. The power transistors 44 are cooled using the thermal conduction path of heat sink 10 with airflow directed through channel 28. The path of the channel 28 traverses, or passes directly under, the power transistors 44 and the placement of the throttles 34 is adjacent to, or directly under, the location of the power transistors 44.

Referring now to FIG. 3, therein is a cutaway front view of a transceiver unit used, for example, in a wireless base station communications system in accordance with the present invention and denoted generally as 50. Transceiver unit 50 comprises a transceiver module 52 used to enable transmission and reception of signals. Transceiver module 52 may also comprise many heat-generating electronic devices, such as the heat-generating electronic devices found on the power amplifier module 40 illustrated in FIG. 2.

Transceiver unit 50 also comprises heat sink 10 thermally coupled to transceiver module 52 and a cover 56 for environmental protection. The high-powered electronic devices, such as the power transistors 54, are positioned on heat sink 10 with channel 28 adjacently traversing the location of the power transistors 54. The position of the throttle 34 within the channel 28 is located adjacent to the position of the power transistors 54 attached to the top surface 16 of heat sink 10. Airflow targeted through heat sink 10 will efficiently remove high concentrations of heat and effectively keep the temperature of transceiver module 52 at normal operating temperatures.

Figure 4:
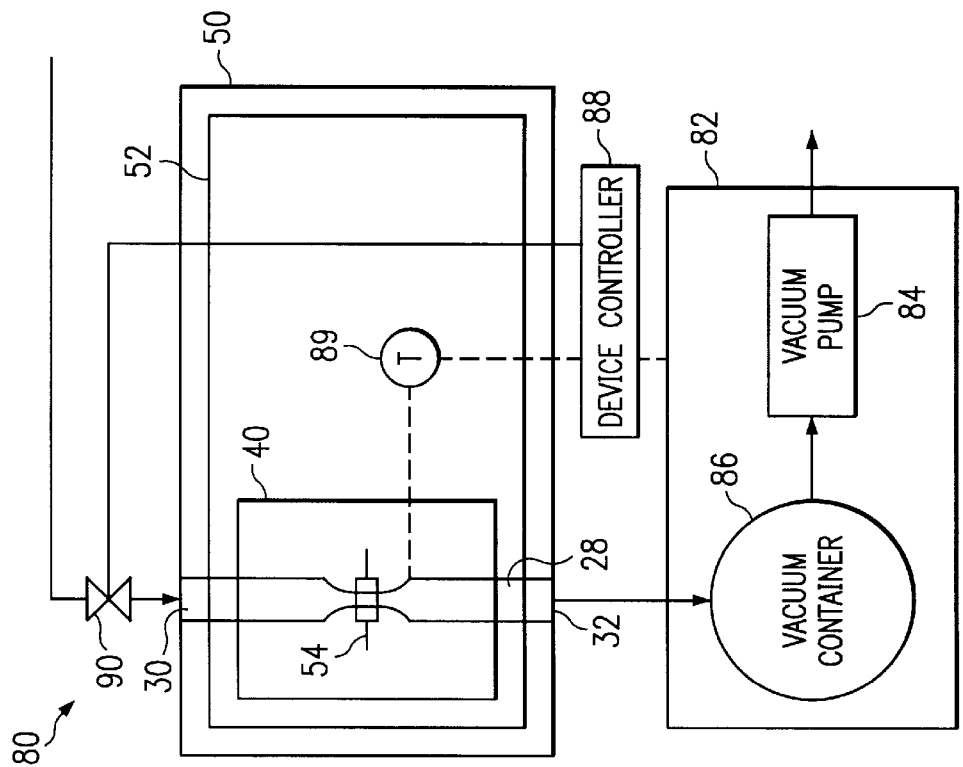
FIG. 4 is an illustration of a transceiver unit implemented within a system for generating airflow through the transceiver unit in accordance with the present invention.

Referring now to FIG. 4, therein is an illustration of transceiver unit 50 of FIG. 3 implemented within a system denoted generally as 80 for generating airflow through the transceiver unit 50, according to an embodiment of the invention. Air generation system 82 comprises a vacuum pump 84 and may also include a vacuum container 86 disposed between vacuum pump 84 and outlet 32 of the transceiver unit 50. Vacuum pump 84 is operable connected to outlet 32 using, for example, rubber, plastic or metal conduit.

Air generation system 82 works to pull air through the channel 28 of the transceiver unit 50, effectively and efficiently cooling power amplifier module 40. In this embodiment, vacuum is created by a compressed air driven vacuum pump 84. A negative pressure is created in the vacuum container 86 resulting in a negative pressure created in the conduit. Airflow, indicated by the direction of the arrow, is then drawn through channel 28 of transceiver unit 50. Vacuum pump 84 may be of any type, such as, for example, a rotary pump or piston pump.

A device controller 88 communicably coupled to the transceiver unit 50 collects temperature measurements from a temperature sensor 89 located adjacent to an electronic device, such as power transistors 54 within the transceiver unit 50. Device controller 88 also may be communicably coupled to the air generation system 82 for controlling the on and off operation of the air generation system 82. Device controller 88 is also operable connected to an airflow control valve 90 for increasing or decreasing the amount of airflow received by the electronic device.

Data control lines, indicated by short dashed lines, provide information to the device controller 88 for determining how much to open or close the airflow control valve 90. Airflow control valve 90 is adjusted according to temperature measurements collected from the transceiver unit 50 and the optimum operating temperature conditions specified by the targeted electronic device. For example, the power transistors 54 may achieve optimum performance at designated temperatures.

Figure 5:
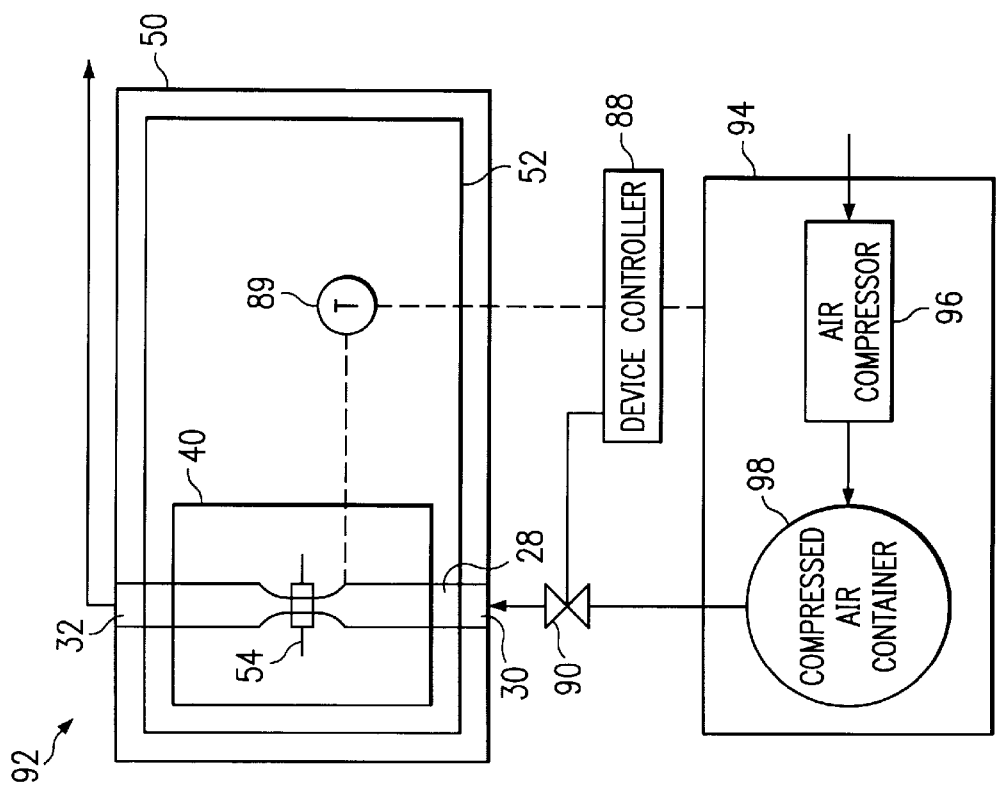
FIG. 5 is an illustration of a transceiver unit implemented with an alternative system for generating airflow through the transceiver unit in accordance with an alternative embodiment of the invention.

Referring now to FIG. 5, therein is an illustration of the transceiver unit 50 of FIG. 3 implemented with an alternative system, denoted generally as 92, for generating airflow through transceiver unit 50 according to an alternative embodiment of the invention. Air generation system 94 comprises an air compressor 96 and may also include a compressed air container 98 disposed between air compressor 94 and inlet 30. Air compressor 94 is operable connected to the inlet 30 of transceiver unit 50 using any kind of connection, for example, metal, plastic or rubber conduit. In this embodiment, the compressed air container 96 is overpressurized and the pressure within air container 96 pushes air through the channel 28 of the transceiver unit 50.

Device controller 88 is communicably coupled to the transceiver unit 50 where temperature measurements are collected from a temperature sensor 89 located adjacent to an electronic device, such as power transistor 44 within the transceiver unit 50. Device controller 88 also may be communicably coupled to the air generation system 82 for controlling the on and off operation of the air generation system 82. Device controller 88 is also operable connected to the airflow control valve 90 for increasing or decreasing the amount of airflow received by the electronic device.

Data control lines, data control lines indicated by short dashed lines, provide information to the device controller 88 for determining how much to open of close the airflow control valve 90. Airflow control valve 90 is adjusted according to temperature measurements collected from the transceiver unit 50 and the optimum operating temperature conditions specified by the targeted electronic device. For example, the power transistor 54 may achieve optimum performance at designated temperatures.

In operation, the present invention may be used in systems housing many transceiver units 50, for example, a wireless base station communications system, where more efficient removal of generated heat may reduce required space and improve systems reliability. For example, in a base station for a wireless communications system, multiple transceiver units 50 may be found. Typically the transceiver units 50 are cooled using large heat sinks with heat dissipating fins and many cooling fans. The present invention would reduce the size of the heat sink and reduce the dependence on cooling fans.

Figure 6:
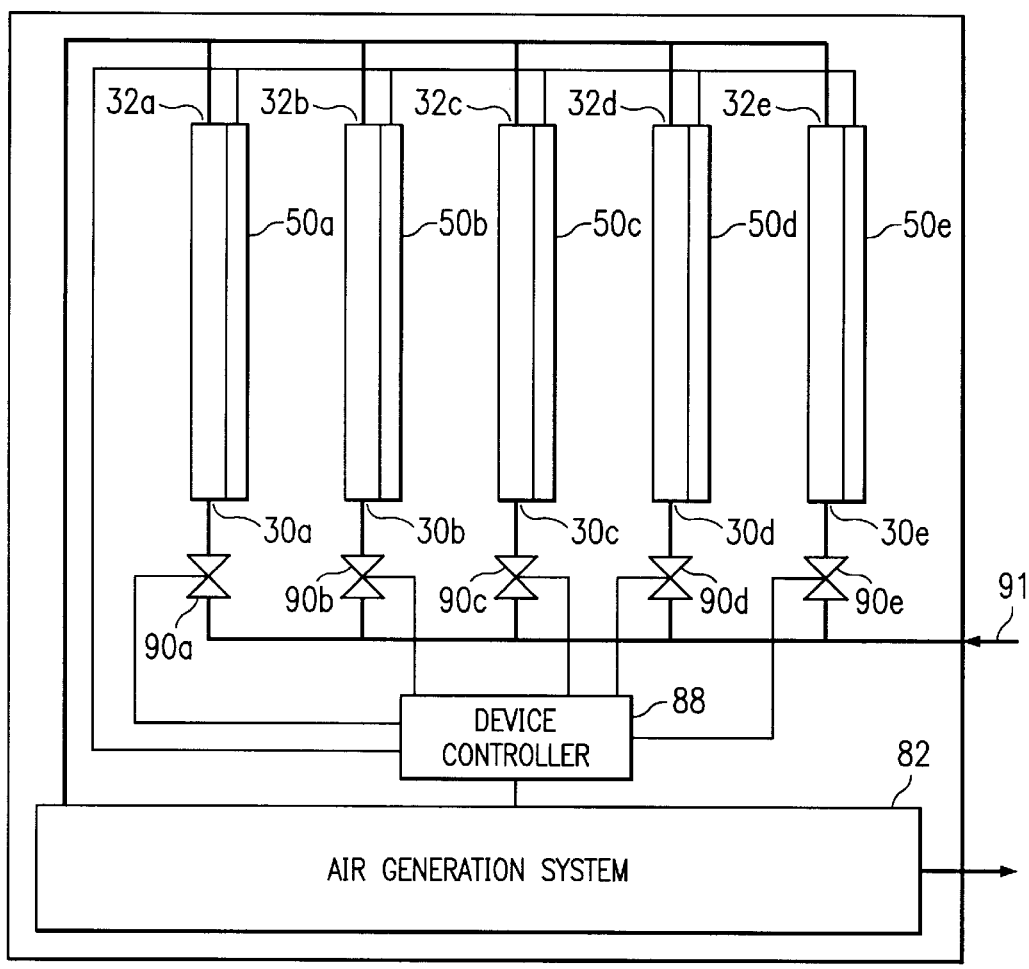
FIG. 6 is an illustration of a base station employing the use of an embodiment of the invention.

Referring now to FIG. 6, therein is an illustration of a base station, denoted generally as 100, shown employing the use of an embodiment of the invention. Base station 100 is shown here with multiple transceiver units 50a–50e, each at which may have a defined profile of channels, such as channel 28 of FIG. 1, depending on the requirements of the transceiver module 52 housed within the transceiver unit 50. Each inlet 30a–30e of transceiver unit 50a–50e is coupled to an outside source of air 91, and each outlet 32a–32e is coupled to air generation system 82. Air generation system 82 also disposes generated heat from the transceiver units 50a–50e outside the base station and uses circulated outside air, airflow indicated by the direction of arrows, to cool transceiver units 50a–50e. The system for generating airflow may be implemented, for example, as system 80 of FIG. 4 or air generation system 94 of FIG. 5.

Device controller 88 is communicable coupled to each transceiver unit 50a–50e and the air generation system 82. Temperature measurements collected from each transceiver 50a–50e are sent to the device controller using data control lines, data control lines indicated by short dashed lines. Airflow control valves 90a–90e are operable connected to the inlet 30a–30e for each transceiver unit 50a–50e and controlled by the device controller 88. If a transceiver unit 50a–50e is operating above or below normal operating temperatures, the airflow control valves 90a–90e may be adjusted by the device controller 104 to increase or decrease the amount of air intake each transceiver unit 50a–50e receives. Data control lines to the air generation system 82 control the operation of the air generation system 82. For example, the air generation system 82 may not be operated until at least one transceiver unit 50a–50e has generated enough heat to require airflow.

While this invention has been described with reference to particular embodiments, this description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A method for cooling an electronic device, said method comprising the steps of:

coupling said electronic device to a heat sink, the heat sink having a top surface for receiving the electronic device, a finned bottom surface and a channel positioned adjacent to the top surface and above the finned bottom surface, the channel adjacently traversing the top surface, the channel having an inlet and an outlet;

generating airflow through said channel in said heat sink coupled to said electronic device, with said channel adjacently traversing said electronic device; and positioning said electronic device adjacent to a throttle, where said throttle comprises a section of said channel having a decreased cross-sectional area.

2. The method as recited in claim 1, further comprising the steps of:

controlling the amount of airflow through said heat sink using an airflow valve connected to said inlet of said channel; and adjustment of said airflow control valve according to temperature measurements collected from said electronic device.

3. The method as recited in claim 1, wherein the step of generating airflow through a channel in said heat sink further comprises using a vacuum pump to generate airflow.

4. The method as recited in claim 1, wherein the step of generating airflow through a channel in said heat sink further comprises using an air compressor to generate airflow.

5. A system for cooling an electronic device comprising;

a heat sink coupled to at least one electronic device, said heat sink having a top surface for receiving said at least one electronic device, a finned bottom surface and a channel positioned adjacent to the top surface and above the finned bottom surface, the channel adjacently traversing the top surface, the channel having an inlet and an outlet;

an air generation system operably connected to said heat sink for generating airflow between said outlet and said inlet of said channel; and at least one throttle formed within said channel between said inlet and said outlet, wherein said throttle comprises a portion of said channel having a decreased cross-sectional area and is located adjacent to said at least one electronic device.

6. The system as recited in claim 5 further comprising:

an airflow control valve operably connected to said inlet of said heat sink for controlling the amount of airflow through said heat sink; and a device controller connected to said airflow control valve and said air generation system, wherein said device controller controls the operation of said air generation system and adjusts said airflow control valve according to temperature measurements collected from said at least one electronic device.

7. The system as recited in claim 6 for cooling an electronic device, wherein said top surface comprises a top outer surface and wherein said heat sink comprises:

a first part comprising a finned heat sink having the finned bottom surface and a top inner surface having a first groove, the first groove defining a first path; and a second part comprising a heat sink base having the top outer surface and a lower inner surface having a second groove, the second groove defining a second path, wherein the first groove and the second groove are congruent and the finned heat sink is coupled to the heat sink base and the top inner surface is in contact with the lower inner surface forming said channel.

8. The system as recited in claim 7, wherein said finned heat sink having a finned lower surface comprises multiple parallel and vertical fins.

9. The system as recited in claim 7, wherein said grooved lower inner surface and said grooved upper inner surface define said channel and said at least one throttle, when said finned heat sink is mounted in said heat sink base.

10. The system as recited in claim 7, wherein said channel formed in said heat sink adjacently traverses the location of a single electronic device through said heat sink.

11. The system as recited in claim 7, wherein said channel formed in said heat sink adjacently traverses the location of multiple electronic devices through said heat sink.

12. The system for cooling as recited in claim 5, wherein an air generation system comprises a vacuum pump operably connected to said outlet for generating airflow between said outlet and said inlet of said channel.

13. The system for generating airflow as recited in claim 12 further comprising a container for creating a vacuum, said container disposed between said outlet and said vacuum pump.

14. The system for cooling as recited in claim 5, wherein said air generation system further comprises an air compressor operably connected to said outlet for generating airflow between said outlet and said inlet of said channel.

15. The system for generating airflow as recited in claim 14 further comprising a container for storing compressed air, said container disposed between said outlet and said air compressor.

16. The system for cooling as recited in claim 5, wherein said at least one throttle comprises a plurality of throttles and said at least one electronic device comprises a plurality of electronic devices, and where each of said plurality of throttles is located adjacent to one of said plurality of electronic devices.

* * * * *